United States Patent
Borkenhagen et al.

(10) Patent No.: US 12,438,547 B2
(45) Date of Patent: Oct. 7, 2025

(54) PHASE-LOCKED LOOP UPDATE CANCELLATION

(71) Applicant: International Business Machines Corporation, Armonk, NY (US)

(72) Inventors: John Borkenhagen, Rochester, MN (US); Christopher Steffen, Rochester, MN (US); Grant P. Kesselring, Rochester, MN (US); James Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 18/492,453

(22) Filed: Oct. 23, 2023

(65) Prior Publication Data
US 2025/0132763 A1    Apr. 24, 2025

(51) Int. Cl.
*H03L 7/089* (2006.01)

(52) U.S. Cl.
CPC .................. *H03L 7/0891* (2013.01)

(58) Field of Classification Search
CPC ............ H03L 7/08; H03L 7/085; H03L 7/093
See application file for complete search history.

(56) References Cited

U.S. PATENT DOCUMENTS

| | | |
|---|---|---|
| 6,239,632 B1 | 5/2001 | Moyal |
| 7,816,958 B2 * | 10/2010 | Sundby ................. H03L 7/0891 327/158 |
| 8,917,126 B1 | 12/2014 | Ficke |
| 10,250,267 B2 | 4/2019 | Friend |
| 10,439,620 B2 | 10/2019 | Srinivas |
| 10,944,386 B1 | 3/2021 | Wu |
| 11,527,953 B1 | 12/2022 | Strom |
| 11,595,047 B1 | 2/2023 | Park |
| 2006/0034403 A1 | 2/2006 | Huang |
| 2008/0116947 A1 | 5/2008 | Lobb |

(Continued)

OTHER PUBLICATIONS

Abolhasani, Alireza & Mousazadeh, Morteza & Khoei, Abdollah. (2020). Fast-locking PLL based on a novel PFD-CP structure and reconfigurable loop filter. IET Circuits, Devices & Systems. 14. 1235-1242. 10.1049/iet-cds.2019.0561.

(Continued)

*Primary Examiner* — Diana J. Cheng
(74) *Attorney, Agent, or Firm* — CANTOR COLBURN LLP; Yuanmin Cai (57) ABSTRACT

A pulse limiter circuit of a phase-locked loop (PLL) receives, from a phase frequency detector of the PLL, first second input pulses, where pulse widths of the first and second input pulses indicate whether a reference clock signal leads or lags a feedback clock signal. The pulse limiter circuit determines whether a pulse width of the first or second input pulse is greater than a selected duration indicative of transient phase jitter. Based on determining the pulse width of the first or second input pulse is greater than the selected duration, the pulse limiter circuit sets a pulse width of a first output pulse equal to a pulse width of a second output pulse width and outputs the first and second output pulses to a charge pump of the PLL, such that no phase adjustment to the feedback clock signal is made based on the first and second input pulses.

14 Claims, 5 Drawing Sheets

(56) References Cited

U.S. PATENT DOCUMENTS

2023/0074921 A1    3/2023    Sjöland

OTHER PUBLICATIONS

Buddha, Dharani, and Umakanta Nanda. 2023. "Dead Zone Minimization Using Variable-Delay Element in CP-PLL for 5G Applications" Micromachines 14, No. 1: 81. https://doi.org/10.3390/mi14010081.

Nanda, Umakanta & Acharya, Debiprasad & Patra, Sarat. (2014). Low Noise and Fast Locking Phase Locked Loop Using a Variable Delay Element in the Phase Frequency Detector. Journal of Low Power Electronics. 10. 10.1166/jolpe.2014.1294.

Nandini, R., "Comparison Of Phase Frequency Detectors By Different Logic Gates," International Journal of Innovative Technology and Exploring Engineering (IJITEE) ISSN: 2278-3075, vol. 2, Issue-5, Apr. 2013.

NK, Anushkannan & Haridas, Mangalam. (2016). A Modified PFD Based PLL with Frequency Dividers in 0.18-μ m CMOS Technology. Circuits and Systems. 07. 4169-4185. 10.4236/cs.2016.713343.

\* cited by examiner

PHASE-LOCKED LOOP UPDATE CANCELLATION

BACKGROUND OF THE INVENTION

The present invention relates generally to integrated circuitry, and more particularly, relates to an integrated circuit including a phase-locked loop (PLL) that eliminates an update to a feedback signal if phase difference between the feedback signal and a reference signal is greater than a selected interval.

A PLL is a control circuit configured to generate an output signal having a phase and frequency that is related to the phase and frequency of a periodic input reference signal. A PLL commonly includes a phase detector, a loop filter, and a voltage-controlled oscillator (VCO), whose output signal is coupled to the phase detector in a feedback loop. In this arrangement, the phase detector compares the phase of the input reference signal with the phase of the output signal and produces an output related to the phase difference. This difference is smoothed by the loop filter, which provides a voltage proportional to the phase difference to the VCO. The VCO varies the frequency and phase of the output signal proportionally to the voltage applied by a loop filter.

The present application appreciates that the input reference signal of a PLL can experience episodic phase jitter stemming from a variety of causes, such as electrostatic discharge (ESD), alpha rays, physical perturbation, switching between redundant input reference signals, etc. In some prior art systems, a large phase change in the input reference signal can cause a correspondingly large feedback response, which, for a large number of cycles, can negatively impact downstream circuitry that relies upon the PLL output signal as a stable reference.

SUMMARY OF THE INVENTION

The present application therefore appreciates that it would be useful and desirable to provide a PLL that eliminates an update to PLL output signal fed back to the phase detector if phase difference between the feedback signal and a reference signal is greater than a selected interval.

In accordance with one embodiment, a pulse limiter circuit of a phase-locked loop (PLL) receives, from a phase frequency detector of the PLL, first second input pulses, where pulse widths of the first and second input pulses indicate whether a reference clock signal leads or lags a feedback clock signal. The pulse limiter circuit determines whether a pulse width of the first or second input pulse is greater than a selected duration indicative of transient phase jitter. Based on determining the pulse width of the first or second input pulse is greater than the selected duration, the pulse limiter circuit sets a pulse width of a first output pulse equal to a pulse width of a second output pulse width and outputs the first and second output pulses to a charge pump of the PLL, such that no phase adjustment to the feedback clock signal is made based on the first and second input pulses.

In accordance with common practice, various features illustrated in the drawings may not be drawn to scale. Accordingly, dimensions of the various features may be arbitrarily expanded or reduced for clarity. In addition, some of the drawings may not depict all of the components of a given system, method, or device. Finally, like reference numerals may be used to denote like or corresponding features in the specification and figures.

DETAILED DESCRIPTION OF ILLUSTRATIVE EMBODIMENT

Processor and other integrated circuits within electronic systems often obtain their clock sources from external crystal oscillator chips. Errors associated with the oscillator clock signal may impact reliability of the integrated circuit itself and/or a larger electronic system that incorporates the integrated circuit. As such, an integrated circuit may include a phase-locked loop (PLL) in order to synchronize, filter, etc. the oscillator clock signal and/or to minimize the impact of errors in the oscillator clock signal. Ultimately, oscillator clock signal errors can lead to failure of the electronic system and can necessitate corrective action, such as a system reboot, reset, or restart. Recovering from such errors may be time consuming and may be costly if associated business operations are adversely affected. Consequently, a redundant clock switch (RCS) may be provided. The RCS provides a reference clock output to the integrated circuit. Initially, the reference clock output is generated from a first oscillator clock signal; if the RCS detects an error associated with the first oscillator clock signal, the RCS instead generates the reference clock output from a redundant second oscillator clock signal. As such, problems arising from an oscillator clock signal error may be reduced or avoided.

A typical RCS includes two independent clock sources and a circuit to align and switch between the two independent clock sources. If the independent clock sources are not phase-aligned, the switch-over between clock sources by the RCS can introduce unwanted transient jitter through an associated phase-locked loop (PLL) into downstream circuitry (e.g., processing circuitry, input/output (I/O) circuitry, etc.), potentially causing errors in the operation of the downstream circuitry. Of course, as noted above, there are also numerous other potential sources that could introduce significant, but transient jitter into the periodic reference signal of a PLL. Therefore, it would be useful and desirable to provide a PLL that can appropriately handle transient phase jitter by eliminating any phase response if the detected phase jitter is greater than a predetermined phase difference.

Numerous details are described herein in order to provide a thorough understanding of the example embodiments illustrated in the accompanying drawings. However, some embodiments may be practiced without at least some of the specific details, and the scope of the claims is only limited by those features and aspects specifically recited in the claims. Furthermore, well-known methods, components, circuits, or the like, have not been described in exhaustive detail so as not to unnecessarily obscure more pertinent aspects of the embodiments described herein.

Figure 1:
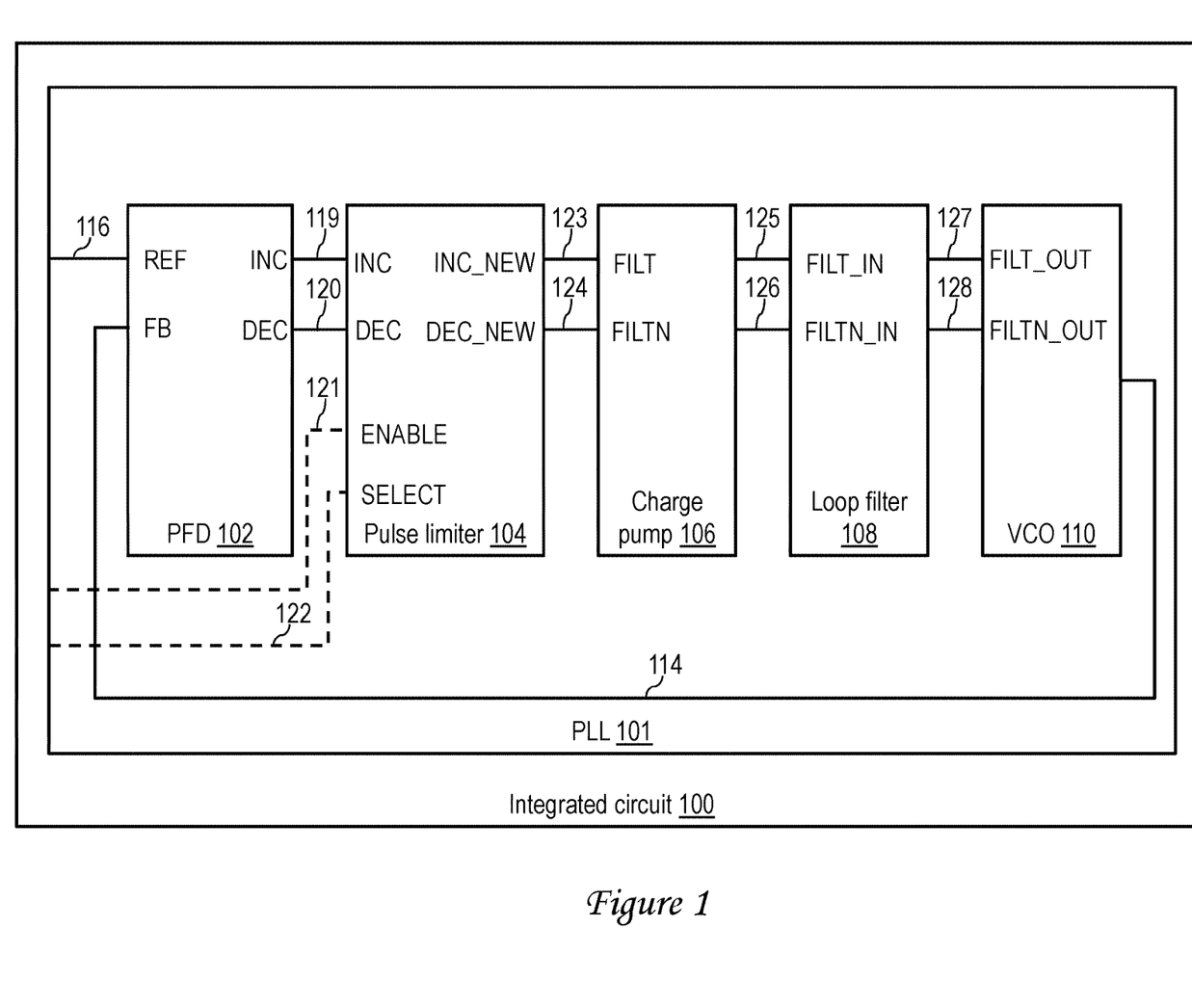
FIG. 1 is a high-level block diagram of an exemplary integrated circuit including a phase-locked loop (PLL) in accordance with one or more embodiments.

With reference now to the figures, and in particular with reference to FIG. 1, there is illustrated a block diagram of an integrated circuit 100 including a PLL 101 in accordance with one or more embodiments. In some embodiments, integrated circuit 100 may be, for example, a processor; in other embodiments, integrated circuit 100 may be an I/O chip or other type of integrated circuit.

In the illustrated example, PLL 101 includes a phase frequency detector (PFD) 102, a pulse limiter 104, a charge pump 106, a loop filter 108, and a voltage controlled oscillator (VCO) 110. PFD 102 compares the phase and frequency of a reference clock signal 116 to the phase and frequency of a feedback clock signal 114 output by VCO 110. Based on the comparison of reference clock signal 116 and feedback block signal 114, PFD 102 generates an output including an increment (INC) pulse 119 and a decrement (DEC) pulse 120, which together represent a phase and frequency difference between reference clock signal 116 and feedback clock signal 114. If PFD 102 detects that the phase of feedback clock signal 114 is lagging the phase of reference clock signal 116, PFD 102 sets the pulse width of the INC pulse 119 wider than the pulse width of DEC pulse 120. If PFD 102 detects that the phase of feedback clock signal 114 is leading the phase of reference clock signal 116, PFD 102 sets the pulse width of DEC pulse 120 wider than the pulse width of the INC pulse 119. If PFD 102 detects that the phase of feedback clock signal 114 is about equal to the phase of reference clock signal 116, PFD 102 sets the pulse width of the DEC pulse 120 about equal to the pulse width of INC pulse 119. In this case, PFD 102 sets the pulse widths of both INC pulse 119 and DEC pulse 120 to be the minimum pulse width generated by PFD 102.

Pulse limiter 104 is configured to receive INC pulse 119 and DEC pulse 120 and output corresponding INC_NEW and DEC_NEW pulses 123 and 124, respectively. In some embodiments, pulse limiter 104 may optionally additionally be coupled to receive an ENABLE signal 121 and a SELECT signal 122. As described in more detail below with reference to FIG. 2, pulse limiter 104 is configured to detect if the pulse width of INC pulse 119 or DEC pulse 120 is greater than a selected pulse width indicative of transient jitter and, if so, to eliminate any update to the phase of feedback clock signal 114. The operation of pulse limiter 104 can be selectively enabled and disabled by assertion or deassertion of ENABLE signal 121. Further, in some implementations, the selected pulse width indicative of transient jitter can be configurable and can be controlled by SELECT signal 122, which in one or more embodiments determines the duration of a selectable delay. In the illustrated example, appropriate ENABLE and SELECT signals 121 and 122 can be generated by unillustrated circuitry within integrated circuit 100. ENABLE signal 121 may, for example, disable operation of pulse limiter 104, for example, when PLL 101 is converging to its locked state and enable operation of pulse limiter 104 when PLL 101 is in its locked state.

INC_NEW pulse 123 and DEC_NEW pulse 124 are transmitted to charge pump 106. INC_NEW pulse 123 and DEC_NEW pulse 124 control charge pump 106 to source or to sink a FILT_IN 125 signal and an inverted FILTN_IN 126 signal to/from loop filter 108. Based on a voltage amount and polarity (i.e., whether charge pump 106 serves as source or sink) of FILT_IN signal 125 and FILTN_IN signal 126, loop filter 108 produces a control FILT_OUT signal 127 and an inverted FILT_OUT signal 128.

FILT_OUT signal 127 and FILT_OUT signal 128 control VCO 110 to produce a feedback clock signal 114 that tracks the phase and frequency of reference clock signal 116.

Generally, the PLL 101 is referred to as operating in a "locked" state when feedback clock signal 114 tracks the phase and frequency of the reference clock signal 116. Those skilled in the art will appreciate, however, that due to process mismatch, circuit performance, or other factors, a small difference may exist between the phases of reference clock signal 116 and feedback clock signal 114 even when PLL 101 is locked. It should also be understood that in some embodiments, a feedback divider may be implemented to divide the output signal of VCO 110 to obtain feedback clock signal 114.

Figure 2:
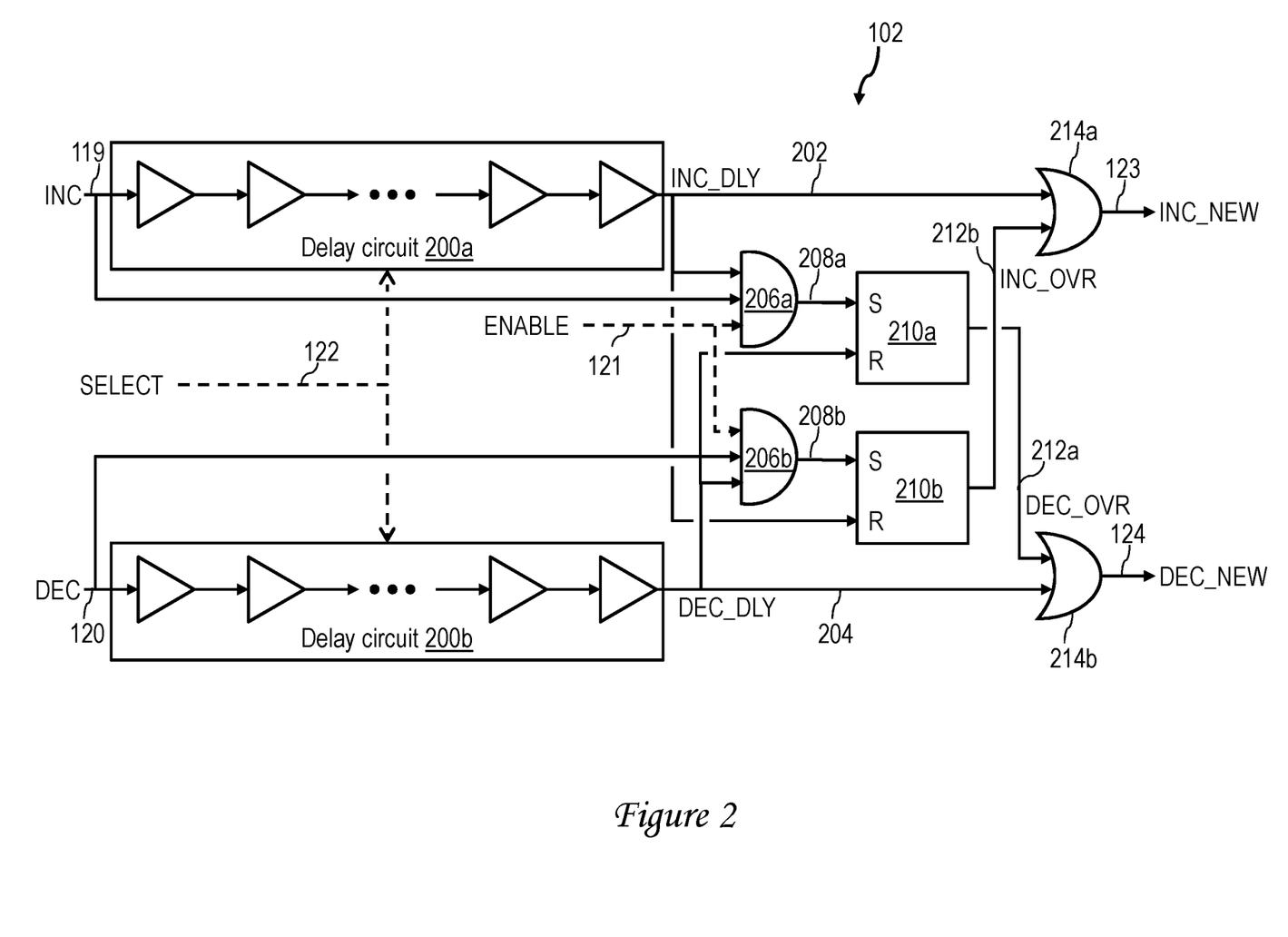
FIG. 2 is a more detailed block logic diagram illustrating an exemplary pulse limiter in accordance with one or more embodiments.

Referring now to FIG. 2, there is depicted a more detailed block diagram of an exemplary embodiment of pulse limiter 104 in accordance with one or more embodiments. In the illustrated example, each of INC pulse 119 and DEC pulse 120 is received from PFD 102 by a respective one of delay circuits 200a, 200b. Each delay circuit 200 imposes a selected delay on the relevant one of INC pulse 119 or DEC pulse 120 of a duration that is indicative of transient phase jitter on reference clock signal 116. In a preferred embodiment, the delay duration (e.g., the number of active delay elements in delay circuit 200) is selected either by implementation or configuration to be equal to the minimum pulse width generated by PFD 102 plus the desired maximum pulse duration. Delay circuit 200a outputs INC_DLY signal 202, and delay circuit 200b outputs DEC_DLY signal 204.

Pulse limiter 102 additionally includes AND gates 206a and 206b, each of which detects whether or not a respective one of INC pulse 119 and DEC pulse 120 has a duration greater than the delay imposed by an associated one of delay circuits 200a and 200b. In the illustrated example, AND gate 206a is configured to receive INC pulse 119, INC_DLY pulse 202, and ENABLE signal 121 as inputs and to generate detect signal 208a as an output. AND gate 206b is similarly configured to receive DEC pulse 120, DEC_DLY pulse 204, and ENABLE signal 121 as inputs and to generate detect signal 208b as an output. Thus, AND gate 206a asserts detect signal 206a if INC pulse 119, INC_DLY pulse 202, and ENABLE signal 121 are all asserted and deasserts detect signal 206a otherwise. Similarly, AND gate 206b asserts detect signal 206b if DEC pulse 120, DEC_DLY pulse 204, and ENABLE signal 121 are all asserted and deasserts detect signal 206b otherwise. Delay circuit 200a and AND gate 206a together form a first detection circuit, and delay circuit 200b and AND gate 206b together form a second detection circuit.

Pulse limiter 102 further includes a pair of set-reset (SR) latches 210a and 210b. SR latch 210a has a set(S) input coupled to detect signal 208a and a reset (R) input coupled to DEC_DLY signal 204; SR latch 210b similarly has a set(S) input coupled to detect signal 208b and a reset (R) input coupled to INC_DLY signal 202. Thus, SR latch 210a asserts decrement override (DEC_OVR) 212a if detect signal 208a is asserted unless DEC_DLY 204 is asserted, and SR latch 210b asserts increment override (INC_OVR) 212b if detect signal 208b is asserted unless INC_DLY 204 is asserted.

Pulse limiter 102 also includes OR gates 214a and 214b. OR gate 214a is coupled to receive INC_OVR signal 212b and INC_DLY pulse 202 as inputs and produce INC_NEW signal 123 as an output. OR gate 214b is coupled to receive DEC_OVR signal 212a and DEC_DLY pulse 204 as inputs and produce DEC_NEW signal 124 as an output. Thus, OR gates 214a and 214b are also referred to herein as output circuits. OR gate 214a asserts INC_NEW 123 if either of INC_DLY pulse 202 or INC_OVR signal 212b is asserted and deasserts INC_NEW 123 otherwise; similarly, OR gate 214b asserts DEC_NEW 124 if either of DEC_DLY pulse 204 or DEC_OVR signal 212a is asserted and deasserts DEC_NEW 124 otherwise.

With the depicted configuration, when PLL 101 is locked pulse limiter 102 typically asserts either INC_NEW signal 123 or DEC_NEW signal 124, depending on the phase difference, if any, between reference clock signal 116 and feedback clock signal 114 detected by PFD 102. If, however, phase jitter on reference clock signal 116 causes either INC pulse 119 or DEC pulse 120 to have a duration greater than the delay imposed by delay circuits 200a, 200b, pulse limiter 102 asserts both INC_NEW signal 123 and DEC_NEW signal 124, canceling the PLL update indicated by PFD 102 and causing charge pump 106 to make no phase change to feedback clock signal 114 output by VCO 110.

Figure 3:
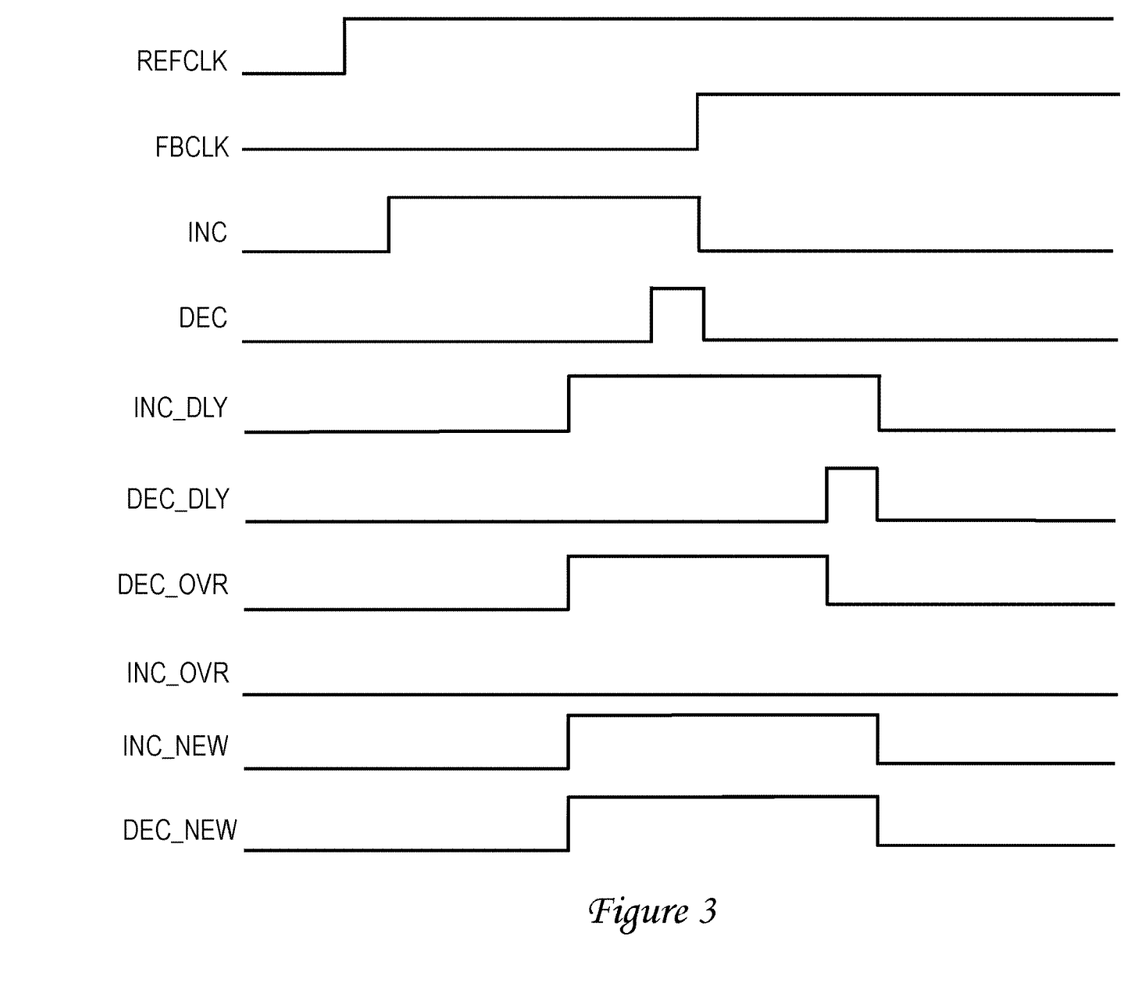
FIG. 3 is an exemplary waveform response of a phase-locked loop in accordance with one or more embodiments.

Referring now to FIG. 3, there is depicted an exemplary waveform response of PLL 101 to occurrence of transient phase jitter in accordance with one or more embodiments. In the depicted example, the phase of reference clock (REFCLK) signal 116 lags the phase of feedback clock (FBCLK) signal 114 due to transient phase jitter. As a result, PFD 102 generates an INC pulse 119 having a large pulse width and a DEC pulse 120 of a minimum pulse width.

INC pulse 119 is delayed by delay circuit 200a to obtain INC_DLY signal 202, and DEC pulse 120 is similarly delayed by delay circuit 200b to obtain DEC_DLY signal 202. Because the duration of INC pulse 119 is greater than the delay of delay circuit 200a, INC pulse 119 and INC_DLY signal 202 are concurrently asserted. Consequently, assuming ENABLE signal 121 is asserted, AND gate 206a asserts detect signal 208a, which causes SR latch 210a to assert DEC_OVR signal 212a and OR gate to consequently assert DEC_NEW signal 124.

The minimum pulse width of DEC pulse 120 means that DEC pulse 120 and DEC_DLY 204 are not concurrently asserted, which causes AND gate 206b to deassert detect signal 208 and SR latch 210b to deassert INC_OVR 212b. However, OR gate 214a asserts INC_NEW signal 123 based on the assertion of INC_DLY 202. As noted above, concurrent assertion of INC_NEW and DEC_NEW signals 123 and 124 provides no voltage drop across the inputs of charge pump 106, eliminating or canceling the update to the phase of feedback clock signal 114 indicated by the INC and DEC pulses 119 and 120 output by PFD 102.

Figure 4:
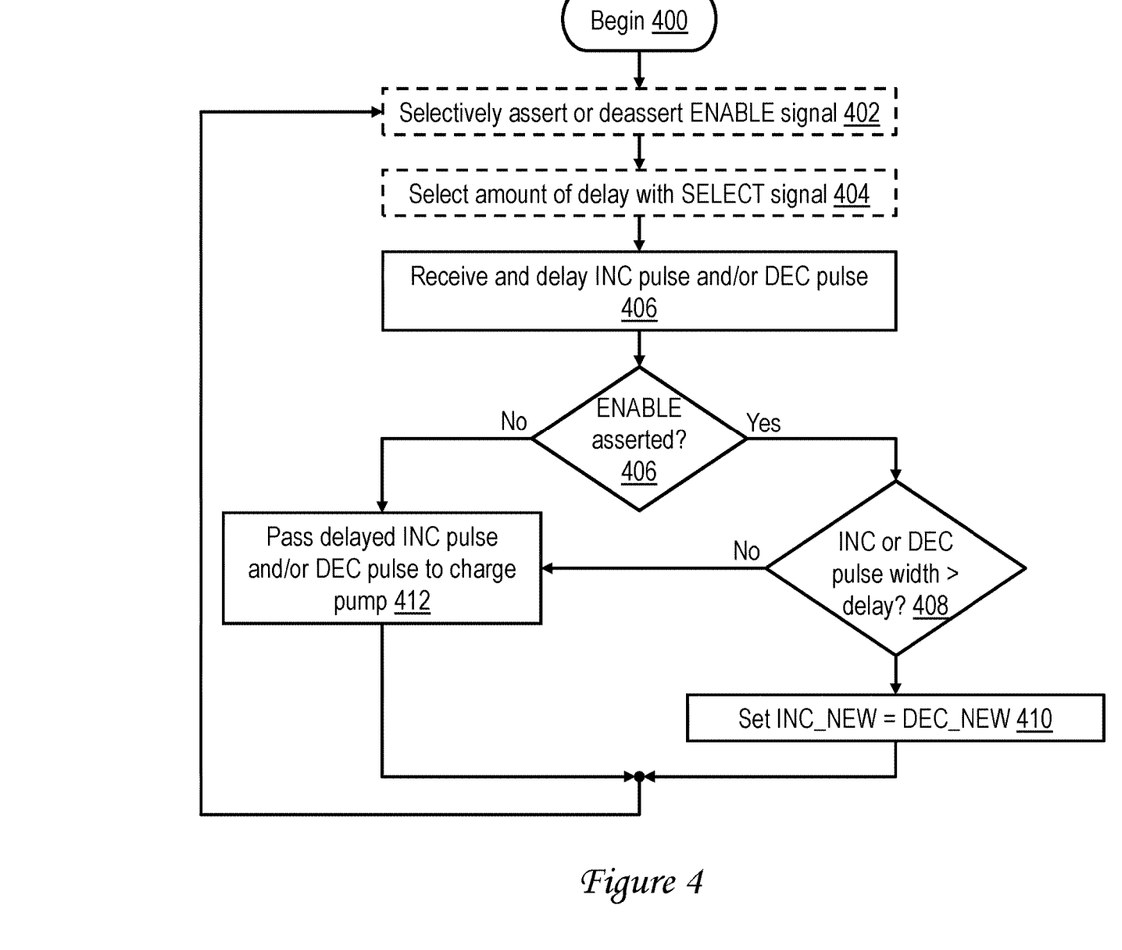
FIG. 4 is a block diagram illustrating a phase-locked loop update cancelation method in accordance with one or more embodiments.

Referring now to FIG. 4, there is depicted a high-level logical flowchart of a phase-locked loop update cancelation method in accordance with one or more embodiments. The illustrated method can be performed, for example, by a PLL 101 having a pulse limiter 104 as described above with reference to FIGS. 1-3.

The method of FIG. 4 begins at block 400 and then proceeds to optional block 402, which illustrates integrated circuit 100 selectively asserting or deasserting ENABLE signal 121 to enable or disable cancelation of updates to feedback clock signal 114, respectively. As noted above, integrated circuit 100 may select to deassert ENABLE signal 121 when PLL 101 is in an unlocked state and to assert ENABLE signal 121 when PLL 101 is in a locked state. Additionally, at optional block 404, integrated circuit 100 can select an amount of delay imposed by delay circuits 200a, 200b utilizing SELECT signal 122. Preferably, integrated circuit 100 sets the delays imposed by delay circuit 200a, 200b to be equal.

Block 406 depicts pulse limiter 104 receiving an INC pulse 119 and/or DEC pulse 120 from PFD 102 and delaying the pulse(s) in delay circuits 200a, 200b. In a typical implementation, pulse limiter 104 receives both an INC pulse 119 and a DEC pulse 120 from PFD 102 each time PFD 102 indicates an update to feedback clock signal 114. As illustrated in FIG. 3, the pulse width of INC pulse 119 or DEC pulse 120 may in some cases simply be a minimum pulse width. Decision block 406 represents that the operation of AND gates 206a, 206b is depends on whether or not ENABLE signal 121 is asserted or deasserted. If ENABLE signal 121 is deasserted, OR gates 214a, 214b simply pass the delayed INC pulse (i.e., INC_DLY pulse 202) and delayed DEC pulse (i.e., DEC_DLY 204) to charge pump 106 as INC_NEW signal 123 and DEC_NEW signal 124 (block 412).

If, on the other hand, ENABLE signal 121 is asserted, the process passes to decision block 408, which further represents the operation of AND gates 206a and 206b in respectively logically combining INC pulse 119 with INC_DLY pulse 202 and DEC pulse 120 with DEC_DLY pulse 204 to determine whether either of INC pulse 119 or DEC pulse 120 has a pulse width (duration) greater than the delay selected for delay circuits 200a and 200b. If not, the process passes from block 408 to block 412, which has been described. If, however, a determination is made at block 408 that INC pulse 119 or DEC pulse 120 has a pulse width (duration) greater than the delay selected for delay circuits 200a and 200b, INC_NEW signal 123 and DEC_NEW signal 124 are both asserted based on the operation of SR latches 210a, 210b and OR gates 214a, 214b, as described above (block 410). The assertion of both INC_NEW signal 123 and DEC_NEW signal 124 has the effect of canceling any update to the VCO 110. Following block 410 or block 412, the process of FIG. 4 returns to block 402 and continues iteratively.

Figure 5:
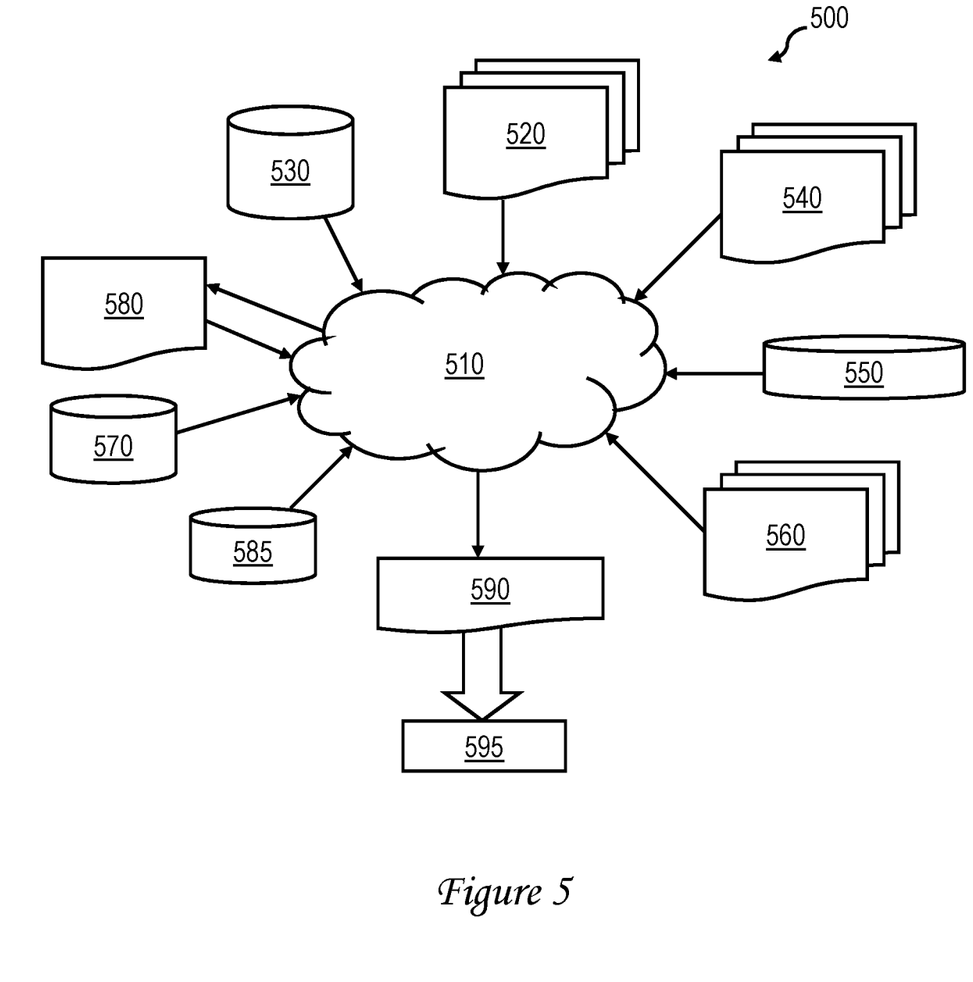
FIG. 5 depicts a design process in accordance with one or more embodiments.

Referring now to FIG. 5, there is depicted a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown herein. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown herein to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 10 nm, 20 nm, 30 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 590 may comprise a compiled, executable HDL simulation model that functionally simulates one or more of the devices shown herein.

Design structure 590 may also employ a data format used for the exchange of layout data of integrated circuits and/or symbolic data format (e.g., information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 590 may then proceed to a stage 595 where, for example, design structure 590: proceeds to tape-out, is released to manufacturing, is released to a mask house, is sent to another design house, is sent back to the customer, etc.

As has been described, in one or more embodiments, a pulse limiter circuit of a phase-locked loop (PLL) receives, from a phase frequency detector of the PLL, first second input pulses, where pulse widths of the first and second input pulses indicate whether a reference clock signal leads or lags a feedback clock signal. The pulse limiter circuit determines whether a pulse width of the first or second input pulse is greater than a selected duration indicative of transient phase jitter. Based on determining the pulse width of the first or second input pulse is greater than the selected duration, the pulse limiter circuit sets a pulse width of a first output pulse equal to a pulse width of a second output pulse width and outputs the first and second output pulses to a charge pump of the PLL, such that no phase adjustment to the feedback clock signal is made based on the first and second input pulses.

The flowcharts and block diagrams in the drawings may illustrate the architecture, functionality, or operations of possible implementations of systems, methods, or devices according to various embodiments of the present invention. In this regard, each block in the flowchart or block diagrams may represent a module, segment, or portion of circuits or circuit systems. In some alternative implementations, the functions noted in the flowchart block may occur out of the order noted. For example, two blocks shown in succession may, in fact, be executed substantially concurrently, or the blocks may sometimes be executed in the reverse order, depending upon the functionality involved.

The descriptions of the various embodiments of the present invention have been presented for purposes of illustration but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A phase-locked loop pulse cancelation method, the method comprising:
   receiving, from a phase frequency detector of a phase-locked loop (PLL) at a pulse limiter circuit of the PLL, a first input pulse and a second input pulse, wherein pulse widths of the first and second input pulses indicate whether a reference clock signal of the PLL leads or lags a feedback clock signal of the PLL;
   delaying the first and second input pulses by the selected duration to obtain a delayed first input pulse and a delayed second input pulse;
   determining, by the pulse limiter circuit, whether a pulse width of the first input pulse or a pulse width of the second input pulse is greater than a selected duration by logically ANDing the first input pulse with the delayed first input pulse and logically ANDing the second input pulse with the delayed second input pulse;
   based on determining the pulse width of the first input pulse or the pulse width of the second input pulse is greater than the selected duration:
      setting, by the pulse limiter circuit, a pulse width of a first output pulse equal to a pulse width of a second output pulse width; and
      sending, by the pulse limiter circuit, the first and second output pulses to a charge pump of the PLL, such that no phase adjustment to the feedback clock signal is made based on the first and second input pulses.

2. The method of claim 1, further comprising:
   selecting, by the pulse limiter circuit, the selected duration based on a select signal.

3. The method of claim 1, wherein:
   the setting comprises performing the setting based on assertion of an enable signal; and
   the method further comprises based on the enable signal being deasserted, sending, by the pulse limiter circuit to the charge pump, first and second output pulses having the pulse widths of the first and second input pulses, respectively.

4. The method of claim 1, wherein the setting includes:
   latching, by a latch of the pulse limiter circuit, a signal indicative of determining the pulse width of the first input pulse is greater than the selected duration; and
   outputting from the latch an override signal that sets the pulse width of the second output pulse.

5. A phase-locked loop comprising:
   a phase frequency detector;
   a pulse limiter coupled to the phase frequency detector;
   a charge pump coupled to the pulse limiter; and
   a voltage-controlled oscillator (VCO) coupled to the charge pump;
   wherein the pulse limiter is configured to:
      receive, from the phase frequency detector, a first input pulse and a second input pulse, wherein pulse widths of the first and second input pulses indicate whether a reference clock signal of the PLL leads or lags a feedback clock signal of the PLL;
      delay the first input pulse and the second input pulse by a selectable duration to obtain a delayed first input pulse and a delayed second input pulse;
      determine whether a pulse width of the first input pulse or a pulse width of the second input pulse is greater than a selected duration by logically ANDing the first input pulse with the delayed first input pulse and logically ANDing the second input pulse with the delayed second input pulse;
      based on determining the pulse width of the first input pulse or the pulse width of the second input pulse is greater than the selected duration:
         set a pulse width of a first output pulse equal to a pulse width of a second output pulse width; and
         send the first and second output pulses to the charge pump, such that no phase adjustment to the feedback clock signal is made by the VCO based on the first and second input pulses.

6. The phase-locked loop of claim 5, wherein the pulse limiter is further configured to select the selected duration based on a select signal.

7. The phase-locked loop of claim 5, wherein:
   the setting comprises performing the setting based on assertion of an enable signal; and the pulse limiter is further configured to, based on the enable signal being deasserted,
   send to the charge pump first and second output pulses having the pulse widths of the first and second input pulses, respectively.

8. The phase-locked loop of claim 5, wherein the setting includes:
   latching, by a latch, a signal indicative of determining the pulse width of the first input pulse is greater than the selected duration; and
   outputting from the latch an override signal that sets the pulse width of the second output pulse.

9. A phase-locked loop comprising:
   a phase frequency detector configured to receive a reference clock signal and a feedback clock signal and to output first and second input pulses, wherein pulse widths of the first and second input pulses indicate whether the reference clock signal leads or lags the feedback clock signal;
   a pulse limiter including:
      first and second detection circuits coupled to receive the first input pulse and the second input pulse, respectively, wherein the first and second detection circuits are configured to detect whether a pulse width of the first input pulse or a pulse width of the second input pulse is greater than a selected duration indicative of transient phase jitter and to generate respective first and second detect signals;
      first and second latch circuits configured to set based on assertion of the first and second detect signals, respectively, and to reset based on assertion of a delayed first input pulse and a delayed second input pulse, respectively; and
      a first output circuit coupled to receive as inputs an output of the second latch and the delayed first input pulse and a second output circuit coupled to receive as inputs an output of the first latch and the delayed second input pulse, wherein the first and second output circuits are configured to respectively output first and second output pulses based on their inputs in lieu of the first and second input pulses of the phase frequency detector.

10. The phase-locked loop of claim 9, wherein the first detection circuit comprises:
a delay circuit that generates the delayed first input pulse based on the first input pulse; and
an AND gate that logically combines the first input pulse and the delayed first input pulse.

11. The phase-locked loop of claim 9, wherein:
the first detection circuit comprises a delay circuit that generates the delayed first input pulse based on the first input pulse; and
the delay circuit is configured to impose a delay of selectable duration based on an a select signal.

12. The phase-locked loop of claim 9, wherein each of the first and second output circuits comprises an OR gate.

13. The phase-locked loop of claim 9, further comprising:
a charge pump coupled to received the first and second output pules; and
a voltage-controlled oscillator (VCO) controlled by the charge pump, wherein the VCO generates the feedback clock signal.

14. The phase-locked loop of claim 9, wherein the first detection circuit is configured to enable and disable output of the first detect signal based on an enable signal.

* * * * *